United States Patent [19]

Desilets et al.

[11] Patent Number: 5,043,786
[45] Date of Patent: Aug. 27, 1991

[54] LATERAL TRANSISTOR AND METHOD OF MAKING SAME

[75] Inventors: Brian H. Desilets, Wappingers Falls; Chang-Ming Hsieh; Louis L. Hsu, both of Fishkill, all of N.Y.

[73] Assignee: International Business Machines Corporation, Armonk, N.Y.

[21] Appl. No.: 548,340

[22] Filed: Jul. 3, 1990

Related U.S. Application Data

[62] Division of Ser. No. 337,802, Apr. 13, 1989, Pat. No. 4,965,217.

[51] Int. Cl.$^5$ ............... H01L 29/72; H01L 29/04; H01L 29/06
[52] U.S. Cl. ............... 357/35; 357/34; 357/59; 357/56
[58] Field of Search ............... 357/34, 35, 59, 56

[56] References Cited

U.S. PATENT DOCUMENTS

| | | | |
|---|---|---|---|
| 3,600,651 | 8/1971 | Duncan | 317/235 R |
| 4,333,227 | 6/1982 | Horng et al. | 29/580 |
| 4,378,630 | 4/1983 | Horng et al. | 357/34 |
| 4,663,831 | 5/1987 | Birrittella et al. | 29/576 E |
| 4,688,073 | 8/1987 | Goth et al. | 357/56 |
| 4,743,565 | 5/1988 | Goth et al. | 437/32 |

FOREIGN PATENT DOCUMENTS 0052038 10/1981 European Pat. Off.
0152116 2/1985 European Pat. Off.

OTHER PUBLICATIONS

IBM Technical Disclosure Bulletin, vol. 13, No. 6, Nov. 1970, p. 1457, "Lateral PNP with Gain Bandwidth Product".

Primary Examiner—Rolf Hille
Assistant Examiner—Wael Fahmy
Attorney, Agent, or Firm—Jeffrey L. Brandt

[57] ABSTRACT

A method of fabricating a lateral transistor is provided, including the steps of: providing a body of semiconductor material including a device region of a first conductivity type; patterning the surface of the device region to define a first transistor region; filling the patterned portion of the device region surrounding the first transistor region with an insulating material to a height generally equal to the surface of with first transistor region; removing portions of the insulating material so as to define a pair of trenches generally bounding opposite sides of the first transistor region; filling the pair of trenches with doped conductive material of opposite conductivity type to the first transistor region; and annealing the semiconductor body whereby to form second and third transistor regions of opposite conductivity type to the first transistor region in the opposing sides of the first transistor region.

4 Claims, 5 Drawing Sheets

LATERAL TRANSISTOR AND METHOD OF MAKING SAME

This application is a division of Ser. No. 07/337,802, filed Apr. 13, 1989, now U.S. Pat. No. 4,965,217.

The present invention relates generally to semiconductor devices, and more particularly to a lateral transistor and a method of making the same.

BACKGROUND OF THE INVENTION

European Patent Application EPA 0 152 116 to Hitachi shows a lateral transistor wherein a base region is formed in a raised, mesa type structure patterned in the surface of an N type epitaxial layer. P type emitter and collector regions are diffused into opposing sides of the base region via doped polysilicon regions formed adjacent the sides of the base region. The general structure of the raised-mesa type structure provides some inherent advantages over other lateral transistor structures, including the ability to form a highly symmetrical, narrow base region. This base region results in good transistor frequency response and gain characteristics.

The process shown and described in the aboveferenced Hitachi application, however, includes several undesirable processing steps which make the process difficult and undesirable to practice. They also result in a less than optimum device. In particular, the process requires the growth of a thick, thermal oxide layer adjoining the bottom edges of the mesa structure under the subsequently formed polysilicon contacts. This thermal oxide results in substantial device stress and subsequent defects. Another disadvantage is the use of photolithographic techniques to define the device contacts. This limits the resolution of the lithography-defined structures, and subsequently limits the minimum size of the device. Other disadvantages of the Hitachi process and device will be discussed below.

U.S. Pat. Nos. 4,688,073 and 4,743,565, both to Goth et al., and both assigned to the assignee of the present invention, show a lateral transistor formed in a raised, semiconductor plateau. Collector and emitter regions are diffused into opposing sides of the plateau via a layer of doped polysilicon. The resulting structure, however, has the disadvantage of being non-planar, and of having device regions to which it is difficult to make contact.

U.S. Pat. No. 4,663,831 to Birrittella et al. shows a vertical bipolar transistor formed with L-shaped polysilicon contacts to the various device region.

U.S. Pat. No. 3,600,651 shows various transistor structures using polysilicon device contacts to single-crystal device regions.

IBM Technical Bulletin titled: "Lateral PNP with Gain Bandwidth Product", Vol. 13, No. 6, November 1970, page 1457, is of interest as showing a lateral PNP transistor. European Patent Application 0 052 038 to Fairchild Camera and Instrument Corp. is of interest as showing a lateral NPN transistor.

SUMMARY OF THE INVENTION

The principal object of the present invention is to provide a new and improved lateral transistor and a method of making the same.

Another object of the present invention is to provide such a method which does not impose undesirable stresses on a semiconductor substrate.

A further object of the present invention is to provide such a method wherein critical device sizes are not severely limited by photolithographic resolution.

In accordance with the present invention, a new and improved method of fabricating a lateral transistor is provided, comprising the steps of: providing a body of semiconductor material including a device region of a first conductivity type; patterning the surface of the device region to define a first transistor region; filling the patterned portion of the device region surrounding the first transistor region with an insulating material to a height generally equal to the surface of with first transistor region; removing portions of the insulating material so as to define a pair of trenches generally bounding opposite sides of the first transistor region; filling the pair of trenches with doped conductive material of opposite conductivity type to the first transistor region; and annealing the semiconductor body whereby to form second and third transistor regions of opposite conductivity type to the first transistor region in the opposing sides of the first transistor region.

In accordance with another aspect of the present invention, a new and improved lateral transistor is provided, comprising: a body of semiconductor material including a device region of a first conductivity type defining a surface; a mesa patterned in the surface of the device region including a first transistor region of the first conductivity type bounded on generally opposite sides by second and third transistor regions of second conductivity type; first and second regions of insulating material disposed in and generally flush with the surface of the device region spaced from each of the second and third transistor regions, respectively, so as to form first and second trenches therebetween; first and second layers of conductive material overlying the first and second regions of insulating material, respectively, and including edges generally adjoining the tops of the first and second trenches, respectively; and first and second regions of doped conductive material filling the first and second trenches, respectively, and forming a conductive links between the second and third transistor regions and the first and second layers of conductive material, respectively.

BRIEF DESCRIPTION OF THE DRAWINGS

These and other objects, features, and advantages of the present invention will become apparent from a consideration of the following detailed description of the invention when read in conjunction with the drawing Figures, in which.

DETAILED DESCRIPTION OF THE INVENTION

Figure 1A:
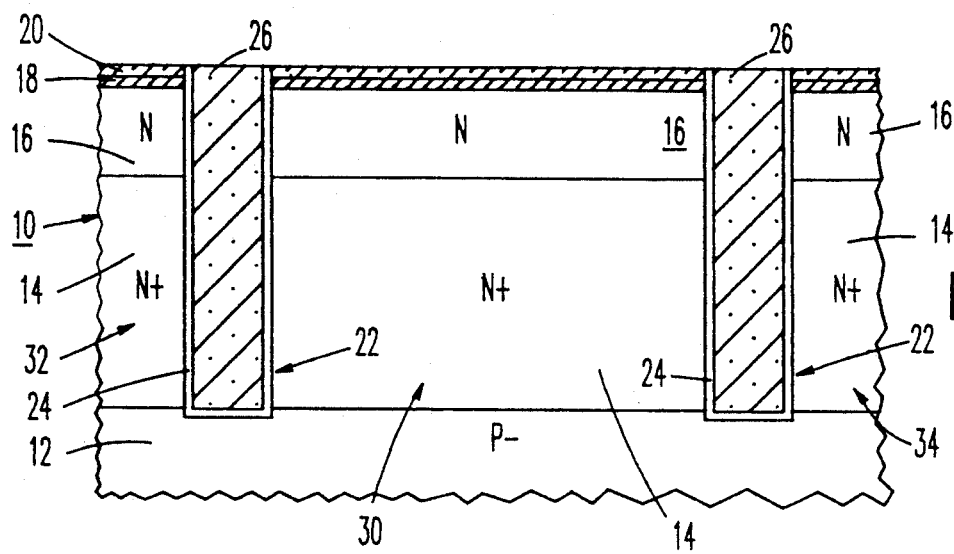
FIGS. 1A-1K show consecutive steps in the formation of a lateral PNP transistor in accordance with the present invention.

Referring now to FIG. 1A, a silicon semiconductor body/chip 10 is provided including a P− substrate layer 12 preferably having a <100> crystallographic orientation and a resistivity in the range of about 15 ohm-cm. A buried N+ layer 14 is formed by implantation or diffusion of N+ ions into the surface of layer 12. An N epitaxial layer 16 is subsequently grown on layer 14, the latter diffusing upward from the top of layer 12 into the bottom of layer 16 to form the three layer chip 10 shown in FIG. 1A. Layer 14 is formed to have a concentration in the range of about $1 \times 10^{20}$ atoms/cm$^3$.

Layer 16 is formed, by a conventional epitaxial growth process, to have a concentration in the range of about $1 \times 10^{16}$ atoms/cm$^3$.

A layer 18 of oxide is grown by a conventional thermal oxidation process over the surface of layer 16 to a thickness in the range of about 100 nanometers (nm). A layer 20 of nitride is deposited by a conventional CVD process over the surface of layer 18 to a thickness in the range of about 100 nm. A layer of oxide (not shown) is deposited by a conventional CVD process over the surface of layer 20 to a thickness in the range of about 600 nm.

Subsequent to the formation of layers 18, 20, and the top oxide layer, a deep isolation trench 22 is formed extending from the upper surface of layer 20 into substrate 12. Trench 22 is formed, for example, through the process of: photolithographic masking (not shown) on the device surface, anisotropic etching of the trench, removal of the photolithographic mask, formation of a thermal oxide 24 on the surface of the etched trench by a conventional thermal oxidation process to a thickness in the range of about 150 nm, filling with polysilicon 26 by a conventional CVD process, and chemical-mechanical polishing of the surface of the device down to the top of layer 20. Other methods of forming deep isolation trench 22 will be known to those skilled in the art.

Trench 22 functions to electrically isolate a device region 30 from adjoining device regions 32, 34 on chip 10.

Figure 1B:
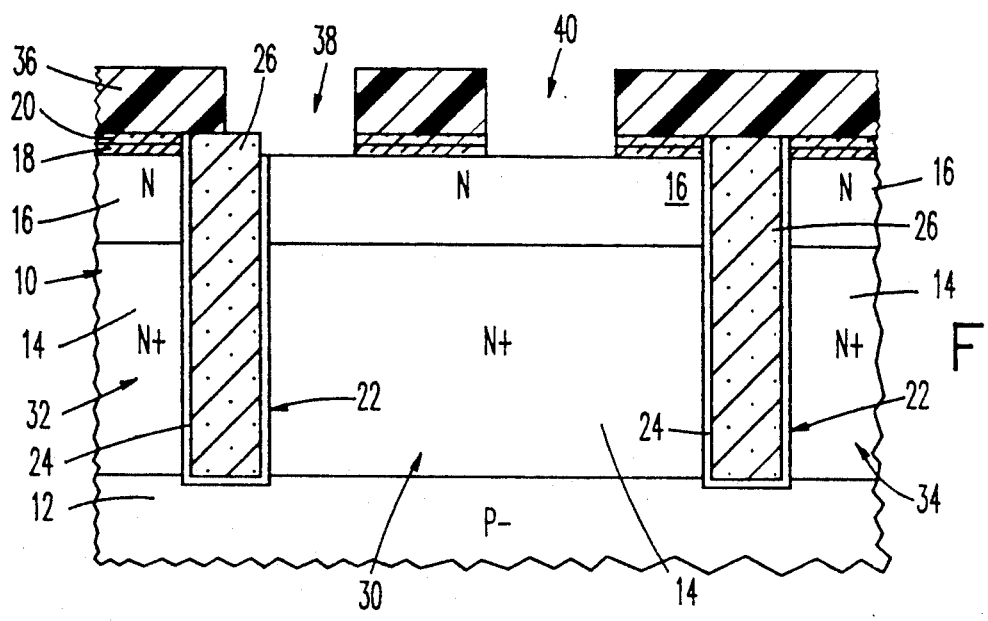

Referring now to FIG. 1B, conventional photolithographic masking techniques are utilized to form a photoresist mask 36 on the device surface, the mask being patterned to define a pair of apertures 38, 40. Apertures 38, 40 bound a masked region generally centered on the surface of device region 30, with aperture 38 exposing a portion of the upper surface of left-most trench region 22.

Subsequent to the formation of mask 36, a $CF_4$ plasma is used in a conventional, anisotropic, reactive ion etch (RIE) to remove the exposed portions of layers 18, 20. Mask 36 is subsequently stripped in a conventional manner.

Figure 1C:
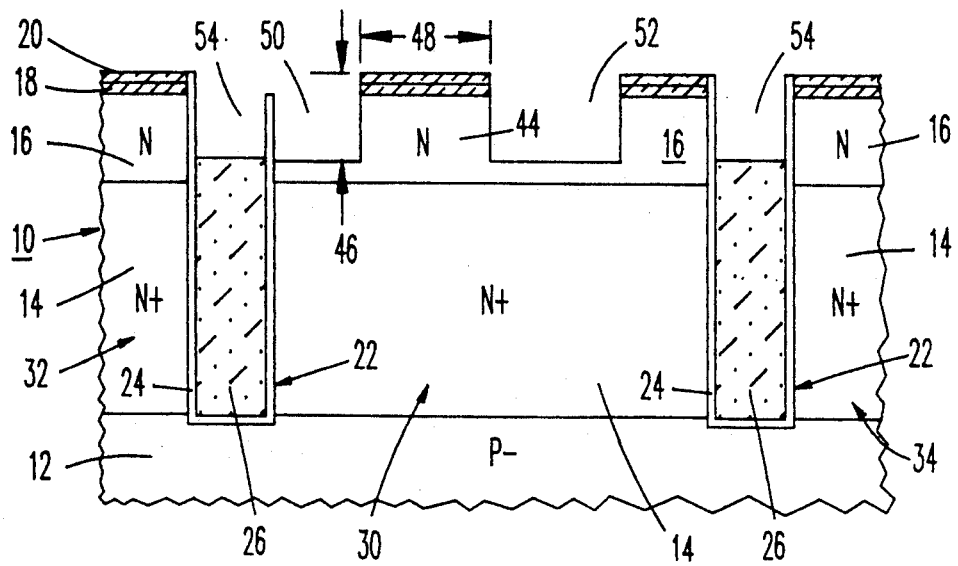

Referring now to FIG. 1C, using layers 18, 20 as a mask, the upper surface of the device is etched with $SF_6 + CL_2$ plasma in an RIE process to pattern a mesa region 44 in the upper surface of layer 16. Mesa 44 is formed to a height 46 in the range of about 0.5–0.9 micrometers, and a width 48 in the range of about 0.3–1.0 micrometers. Wide trenches 50, 52 are formed in the surface of layer 16 bounding opposite sides of mesa 44. The upper surface region 54 of polysilicon 26 in trench 22 is removed, this polysilicon etching at a rate similar to the single-crystal layer 16.

Figure 1D:
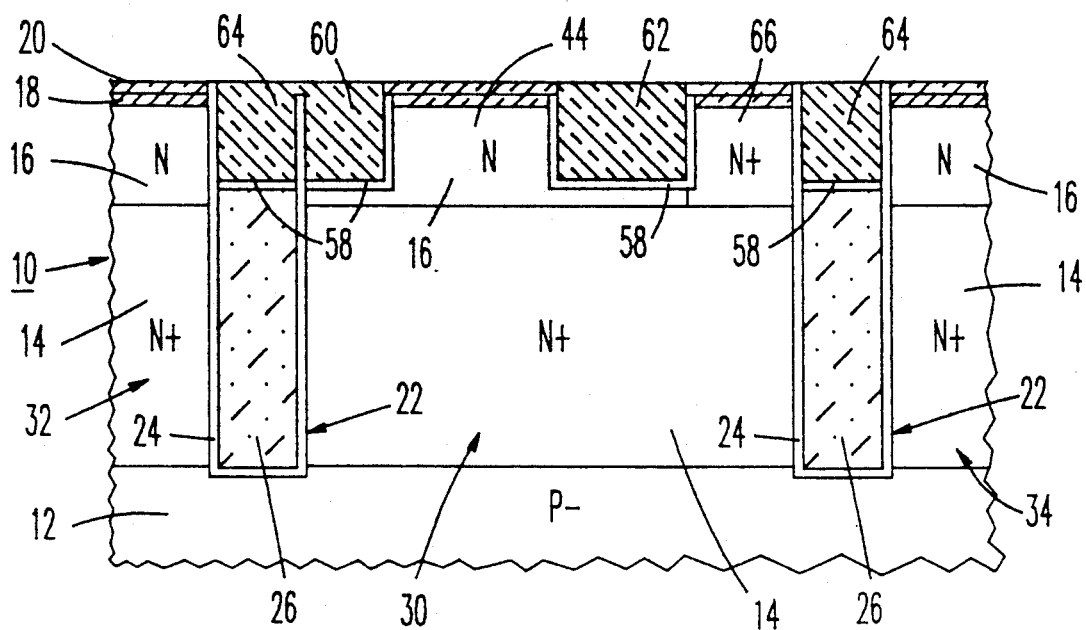

Referring now to FIG. 1D, a layer 58 of oxide is grown by a conventional thermal oxidation process on all exposed single-crystal and polysilicon surfaces to a thickness of about 50 nm. Layer 58 generally lines wide trenches 50, 52 (FIG. 1C), and the upper surface of polysilicon 26 in trench 22. Thermal oxide layer 58 has the advantage of providing good electrical isolation, without being so thick as to cause undue stresses in the structure of layer 16.

Subsequent to the growth of layer 58, a layer (not shown) of CVD oxide is deposited conformally over the surface of the device so as to fill the apertures thereon. A planarizing process, such as a chemicalmechanical polish, is used to planarize the upper device surface flush with the surface of layer 20. Oxide regions 60, 62, 64 thus fill trenches 50, 52, 54 (FIG. 1C), respectively.

A conventional photolithographic mask (not shown) is formed over the surface of the device, and patterned to expose the surface between oxide region 62 and rightmost trench portion 22. Phosphorus ions are then implanted or diffused into the surface of the device so as to form $N^+$ base reachthrough region 66. Base reachthrough region 66 extends from the surface of layer 16 into contact with buried region 14, and is formed to have a surface concentration in the range of about $1 \times 10^{20}$ atoms/cm$^3$.

Figure 1E:
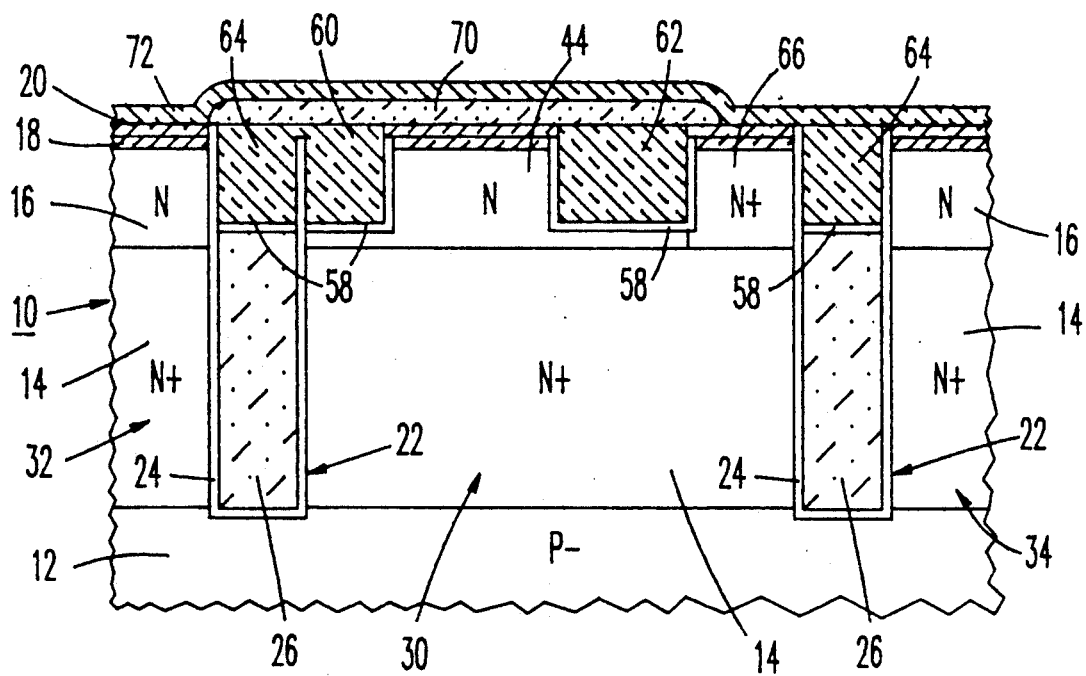

Referring now to FIG. 1E, a layer of polysilicon is deposited conformally (not shown) over the surface of the device using a conventional CVD process and to a thickness in the range of about 200 nm. This polysilicon can be in situ doped, or alternatively Boron ions are implanted into the polysilicon layer at an energy of about 5 Kev and a concentration in the range of about $5-8 \times 10^{15}$/cm$^2$.

A conventional photolithographic process is used to form a mask (not shown) over the polysilicon layer portion overlying left-most trench region 22, and device region 30 excepting for a portion of the surface of reachthrough region 66. The device is then etched in an anisotropic polysilicon etchant, for example an Freon $12 + O_2$ plasma RIE process, to remove the exposed portions of doped polysilicon layer 70. The mask is stripped, and a layer 72 of oxide is deposited conformally over the device using a conventional CVD process to a thickness in the range of about 200 nm.

Figure 1F:
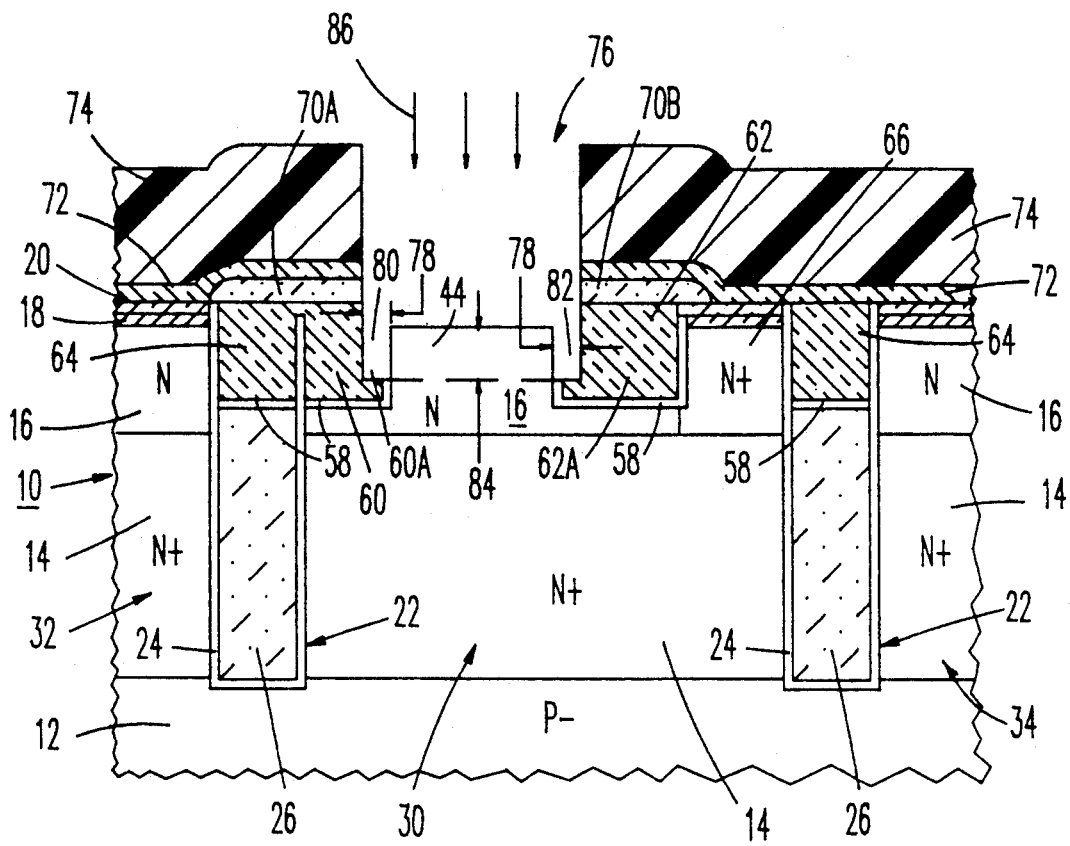

Referring now to FIG. 1F, standard photolithographic techniques are used to form a resist mask 74 overlying the device surface and defining an aperture 76 exposing mesa 44 and a thin, contiguous portion 78 of each of oxide regions 60, 62. Utilizing mask 74, a $CF_4$ plasma is used in an RIE process to etch away the exposed portion of layer 72. An $SF_6 + Cl_2$ plasma is used in an RIE process to etch away the exposed portion of layer 70, leaving electrically separate portions 70A, 70B.

A $CF_4$ plasma is used in an RIE process to etch narrow trenches 80, 82 in the exposed surfaces of oxide regions 60, 62, respectively. Trenches 80, 82 bound opposite sides of mesa 44, and have respective widths 78 in the range of about 0.3–1.0 microns, and depths 84 in the range of about 0.3–0.7 microns. It is an important feature of the present invention that the etch used to form narrow trenches 80, 82 is terminated so as to leave L-shaped oxide extensions 60A, 62A at the bottom of the trenches, respectively. Extensions 60A, 62A are formed to have vertical thicknesses in the range of about 200 nm.

Again using mask 74, phosphorus ions 86 are implanted into the exposed portion of mesa 44 to adjust the concentration to, for example, in the range of about $3 \times 10^{16} - 5 \times 10^{17}$ atoms/cm$^3$. The concentration is dependant on the width of the subsequently formed base region, higher concentrations being desirable for narrower base regions. Resist mask 74 is then stripped by conventional processes.

Figure 1G:
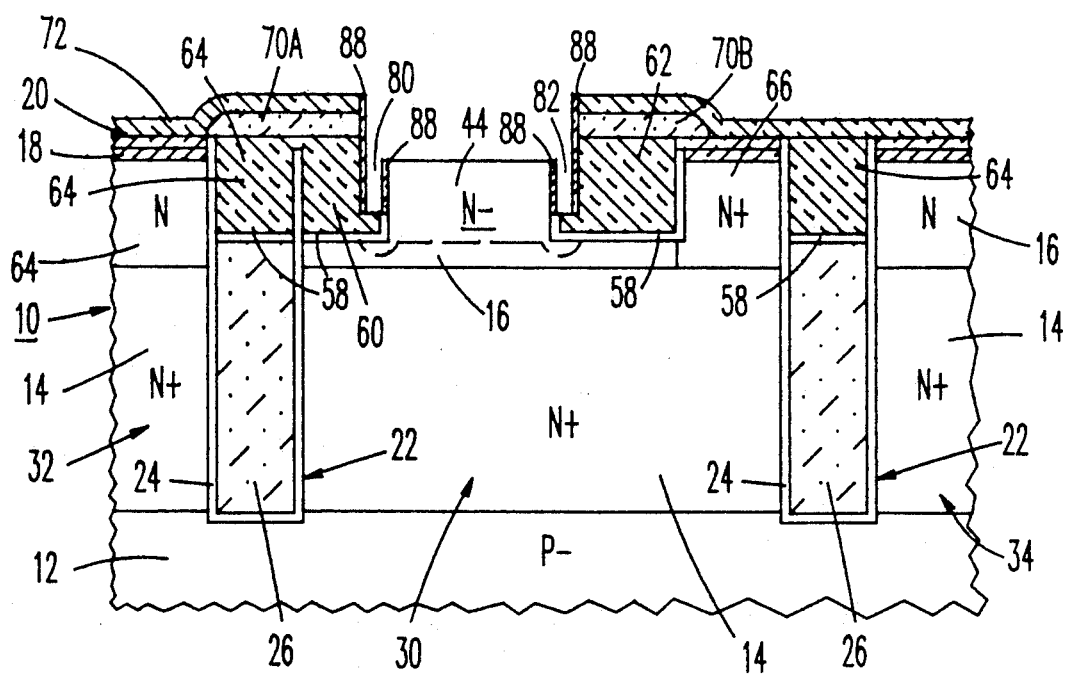

Referring now to FIG. 1G, a layer of nitride is deposited conformally (not shown) over the surface of the device. A $CF_4$ plasma is then used in an RIE process to anisotropically remove horizontal portions of the nitride layer, leaving vertical nitride sidewalls 88 in trenches 80, 82, and over the exposed edges of layers 70A, 70B, 72.

Figure 1H:
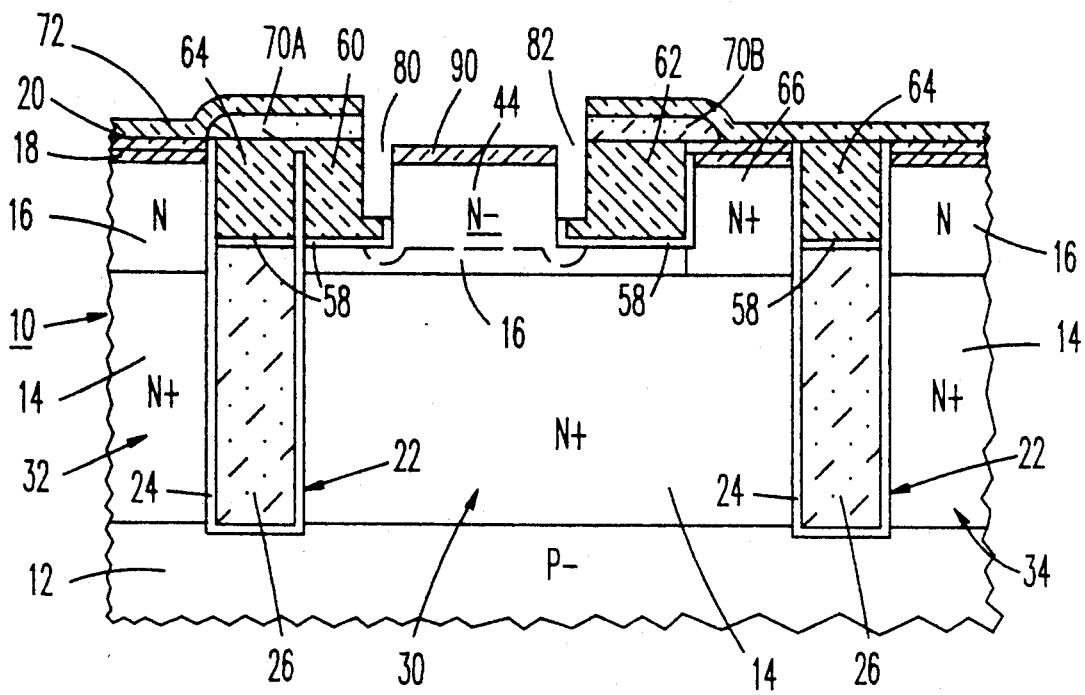

Referring now to FIG. 1H, a layer 90 of thermal oxide is grown over the exposed surface of mesa 44 using a conventional (or, alternatively, a low temperature, high pressure) thermal oxidation process to a thickness in the range of about 300 nm. Layer 90, of course, forms only on the exposed crystalline surface of mesa 44. Subsequent to the formation of layer 90, nitride sidewalls 88 are removed using a conventional wet etch.

Figure 1I:
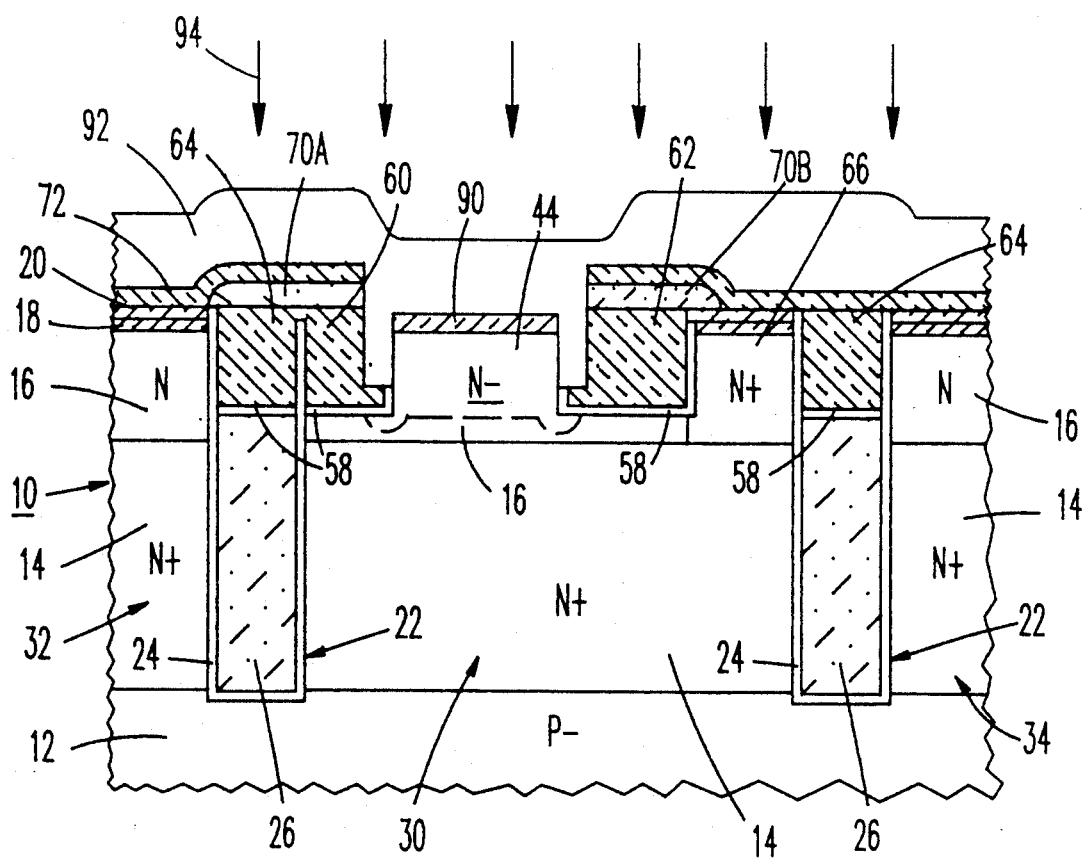

Referring now to FIG. 1I, a layer 92 of polysilicon is deposited conformally over the device surface, using a conventional CVD process and to a thickness in the range of about 0.5-1.0 microns. Layer 92 also functions to fill narrow trenches 80, 82 (FIG. 1H) adjoining opposite sides of mesa 44. The thickness of layer 92 is selected dependent on the width of trenches 80, 82, being sufficient such that after a subsequent anisotropic etch the trench walls remain covered. Layer 92 deposited in situ doped or, alternatively, is doped to a P+ concentration through the implantation of boron ions 94 at an energy of about 5 Kev and a dosage of in the range of about $8.0 \times 10^{15}/cm^2$.

Figure 1J:
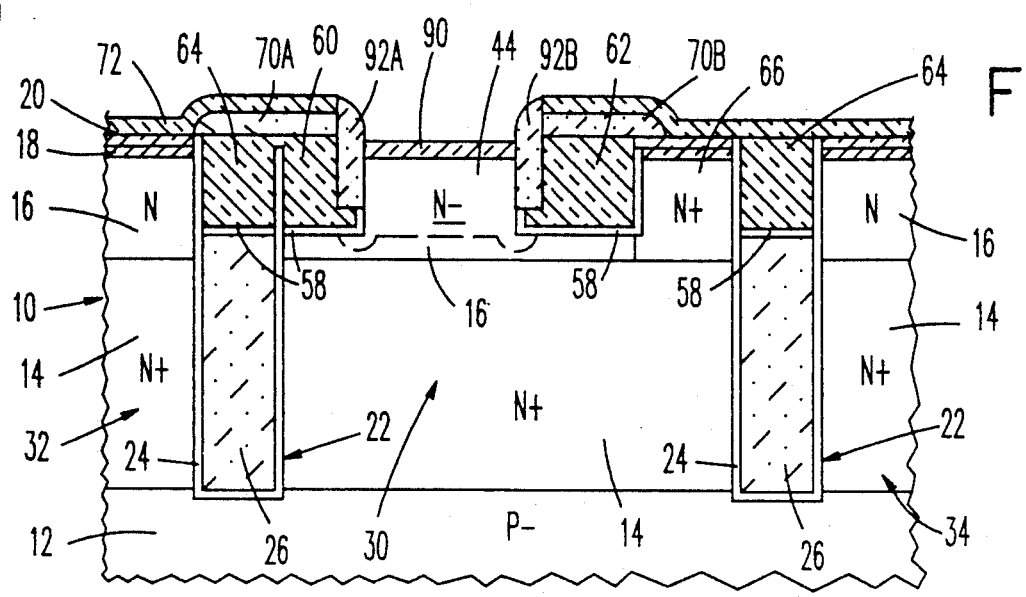

Referring now to FIG. 1J, a $CF_4$ plasma is used in an RIE process to etch the horizontal portions of layer 92, leaving sidewalls 92A, 92B filling narrow trenches 80, 82 (FIG. 1I), respectively. Sidewalls 92A, 92B extend upward into contact with the edges of overlying layers 70A, 70B, respectively, and with the edges of the remaining portions of layer 72.

Figure 1L:
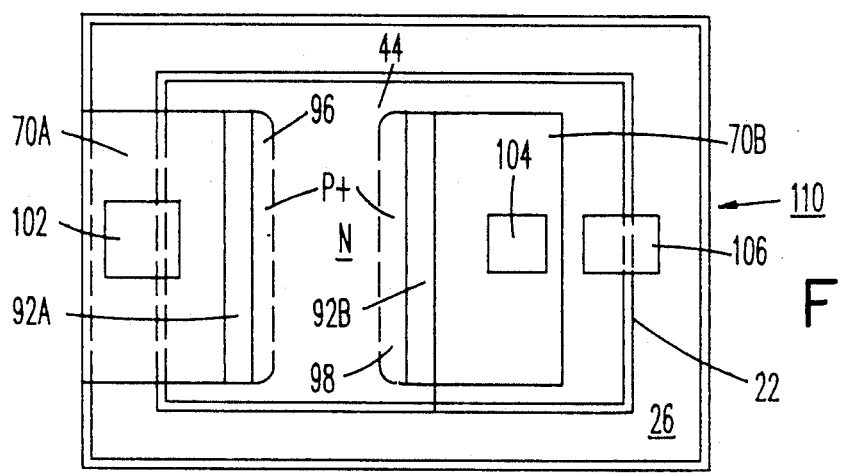
FIG. 1L is a top view of the device of FIG. 1K.
Figure 1K:
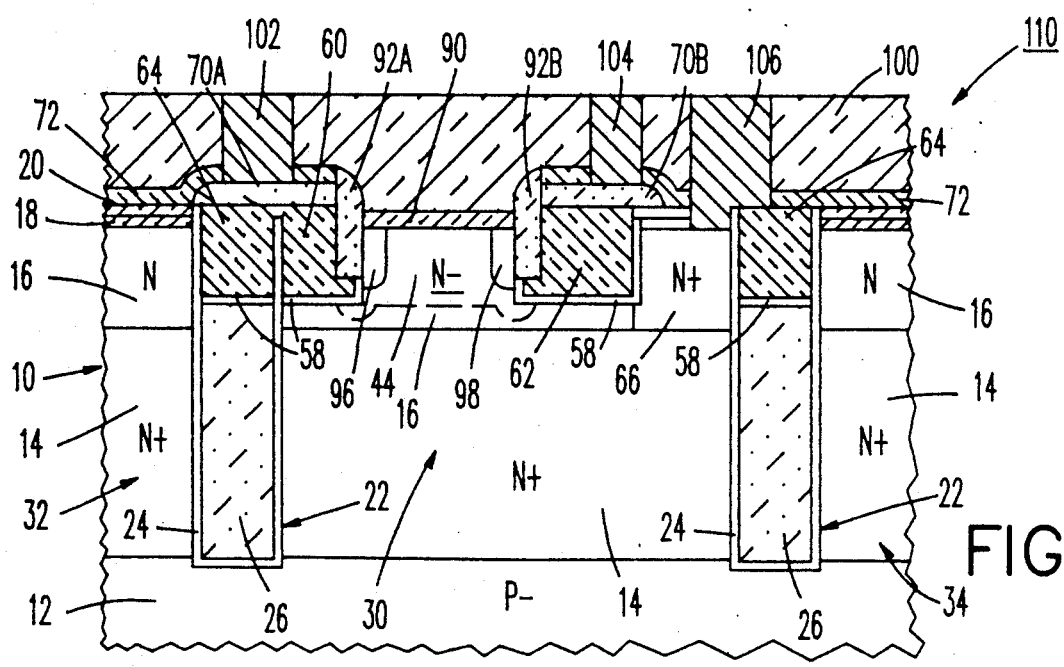

Referring now to FIGS. 1K, 1L, an anneal is performed to drive P dopant out of polysilicon sidewalls 92A, 92B and into opposite sides of mesa 44 so as to form P+ emitter and collector regions 96, 98, respectively. This anneal further activates the electrical connection between sidewalls 92A, 92B, and the associated layers 70A, 70B making contact therewith. A layer 100 of quartz insulation is formed over the surface of the device, for example by a conventional CVD process, and planarized, for example by a chemical-mechanical polish.

Appropriate plasma etchants are used in an RIE process to open contact holes to the layers 70A, 70B and to the surface of reachthrough region 66, so as to accommodate emitter, collector, and base electrodes 102, 104, 106, respectively. These electrodes comprise, for example, a sputtered metal such as tungsten. It is an advantage of the present invention that, because electrodes 102 and 104 are formed over the wider surfaces of layers 70A, 70B, the layers in turn making contact with sidewalls 92A, 92B, the connections between the electrodes and the transistor device regions 96, 98 is not highly dependent on photolithographic resolution.

In accordance with the present invention, there is thus formed a lateral PNP transistor 110 in device region 30. The process shown to form transistor 110 is compatible with the formation of vertical NPN transistors (not shown) in other isolated device regions such as 32, 34.

Transistor 110 includes a narrow base region with highly symmetrical emitter and collector regions, thus exhibiting good frequency response up to about 5 Ghz, and a high beta-gain of greater than 50. The transistor is formed without any oxidizing steps which create unduly high stresses on the device structure. Further, none of the critical device measurements are dependent on photolithographic resolution.

The present invention has particular application in the formation of Very Large Scale Integration (VLSI) bipolar semiconductor devices.

While the invention has been described with respect to preferred embodiments, numerous modifications, changes, and improvements will occur to those skilled in the art without departing from the spirit and scope of the invention.

What is claimed is:

1. A lateral transistor, comprising:
   a body of semiconductor material including a device region of a first conductivity type defining a surface;
   a mesa patterned in said surface of said device region including a first transistor region of said first conductivity type bounded on generally opposite sides by second and third transistor regions of second conductivity type;
   first and second regions of insulating material disposed in and generally flush with said surface of said device region spaced from each of said second and third transistor regions, respectively, so as to form first and second trenches therebetween;
   first and second layers of conductive material overlying said first and second regions of insulating material, respectively, and including edges generally adjoining the tops of said first and second trenches, respectively; and
   first and second regions of doped conductive material filling said first and second trenches, respectively, and forming conductive links between the second and third transistor regions and the first and second layers of conductive material, respectively.

2. A lateral transistor in accordance with claim 1 and further including first and second regions of insulating material underlying each of the first and second regions of doped conductive material in each of said first and second trenches, respectively.

3. A lateral transistor in accordance with claim 2 and further including:
   a buried region of said first conductivity type disposed in contact with the bottom of said first transistor region and extending laterally thereto; and
   a reachthrough region of said first conductivity type extending from the surface of said body into contact with said buried region and spaced from said first, second, and third transistor regions.

4. A lateral transistor in accordance with claim 1 and further including first and second metal contacts to said first and second layers of conductive material, respectively, for making electrical connections thereto.

* * * * *